(12) United States Patent
Meiser et al.

(10) Patent No.: US 9,401,399 B2
(45) Date of Patent: Jul. 26, 2016

(54) SEMICONDUCTOR DEVICE

(71) Applicant: Infineon Technologies AG, Neubiberg (DE)

(72) Inventors: Andreas Meiser, Sauerlach (DE); Till Schloesser, Munich (DE); Franz Hirler, Isen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/053,633

(22) Filed: Oct. 15, 2013

(65) Prior Publication Data

US 2015/0102404 A1    Apr. 16, 2015

(51) Int. Cl.

| | | |
|---|---|---|
| *H01L 29/76* | (2006.01) | |
| *H01L 29/94* | (2006.01) | |
| *H01L 27/108* | (2006.01) | |
| *H01L 29/423* | (2006.01) | |
| *H01L 29/78* | (2006.01) | |

(Continued)

(52) U.S. Cl.
CPC ........ *H01L 29/0653* (2013.01); *H01L 29/4236* (2013.01); *H01L 29/78* (2013.01); *H01L 29/7825* (2013.01); *H01L 29/7835* (2013.01); *H01L 29/7838* (2013.01); *H01L 29/8083* (2013.01); *H01L 29/0692* (2013.01); *H01L 29/0696* (2013.01); *H01L 29/1095* (2013.01); *H01L 29/407* (2013.01); *H01L 29/41766* (2013.01); *H01L 29/42368* (2013.01)

(58) Field of Classification Search
CPC ...................... H01L 29/7827; H01L 29/66666; H01L 29/7813; H01L 29/66734; H01L 29/7802; H01L 29/78; H01L 27/088; H01L 29/7816; H01L 29/792; H01L 29/7811; H01L 29/66833; H01L 29/4236; H01L 29/66712; H01L 27/0629; H01L 29/061
USPC .................................................. 257/330–340
See application file for complete search history.

(56) References Cited

U.S. PATENT DOCUMENTS 6,353,252 B1    3/2002    Yasuhara et al.
6,589,845 B1    7/2003    Nair et al.

(Continued)

FOREIGN PATENT DOCUMENTS

DE    102004056772 B4    1/2007

OTHER PUBLICATIONS

Meiser, et al. "Semiconductor Device and Method of Manufacturing a Semiconductor Device." U.S. Appl. No. 13/692,059, filed Dec. 3, 2012.

(Continued)

*Primary Examiner* — Howard Weiss
*Assistant Examiner* — Nelson Garces
(74) *Attorney, Agent, or Firm* — Murphy, Bilak & Homiller, PLLC

(57) ABSTRACT

A semiconductor device includes a transistor formed in a semiconductor substrate including a main surface. The transistor includes a source region, a drain region, a channel region, and a gate electrode. The source region and the drain region are disposed along a first direction, the first direction being parallel to the main surface. The channel region has a shape of a ridge extending along the first direction, the ridge including a top side and a first and a second sidewalls. The gate electrode is disposed at the first sidewall of the channel region, and the gate electrode is absent from the second sidewall of the channel region.

11 Claims, 9 Drawing Sheets

(51) Int. Cl.
    *H01L 29/06*     (2006.01)
    *H01L 29/808*   (2006.01)
    *H01L 29/40*     (2006.01)
    *H01L 29/417*   (2006.01)
    *H01L 29/10*     (2006.01)

(56) References Cited

U.S. PATENT DOCUMENTS

| | | | |
|---|---|---|---|
| 7,126,166 B2 | 10/2006 | Nair et al. | |
| 7,132,333 B2 | 11/2006 | Schloesser et al. | |
| 7,368,777 B2* | 5/2008 | Kocon | H01L 21/3065 257/302 |
| 7,423,325 B2 | 9/2008 | Tihanyi | |
| 7,622,354 B2 | 11/2009 | Dreeskornfeld et al. | |
| 7,635,893 B2 | 12/2009 | Weis et al. | |
| 7,714,384 B2 | 5/2010 | Seliskar | |
| 7,820,517 B2 | 10/2010 | Gammel et al. | |
| 7,964,913 B2* | 6/2011 | Darwish | H01L 29/0649 257/329 |
| 8,115,253 B2 | 2/2012 | Tang et al. | |
| 2001/0045599 A1* | 11/2001 | Hueting | H01L 29/4236 257/330 |
| 2002/0155685 A1* | 10/2002 | Sakakibara | H01L 29/0634 438/500 |
| 2003/0132463 A1 | 7/2003 | Miyoshi | |
| 2005/0156234 A1 | 7/2005 | Gammel et al. | |
| 2006/0145230 A1* | 7/2006 | Omura | H01L 29/7825 257/302 |
| 2006/0202272 A1 | 9/2006 | Wu et al. | |
| 2006/0237781 A1 | 10/2006 | Marchant et al. | |
| 2007/0221992 A1 | 9/2007 | Seliskar | |
| 2008/0003703 A1* | 1/2008 | Gammel et al. | 438/10 |
| 2009/0020852 A1* | 1/2009 | Harada | 257/579 |
| 2009/0114968 A1 | 5/2009 | Wang et al. | |
| 2009/0267116 A1 | 10/2009 | Wu et al. | |
| 2009/0283825 A1* | 11/2009 | Wang et al. | 257/335 |
| 2010/0176421 A1 | 7/2010 | Van Hove et al. | |
| 2011/0169075 A1 | 7/2011 | Hsieh | |
| 2012/0043638 A1* | 2/2012 | Kitagawa | 257/488 |
| 2012/0061753 A1* | 3/2012 | Nishiwaki | H01L 29/407 257/331 |
| 2012/0199878 A1* | 8/2012 | Shrivastava et al. | 257/192 |
| 2013/0037853 A1* | 2/2013 | Onozawa | H01L 29/0661 257/139 |

OTHER PUBLICATIONS

Vielemeyer, et al. "Integrated Circuit and Method of Manufacturing an Integrated Circuit." U.S. Appl. No. 14/043,971, filed Oct. 2, 2013.
Meiser, A., et al. "Semiconductor Device and Method of Manufacturing a Semiconductor Device." U.S. Appl. No. 13/731,380, filed Dec. 31, 2012.
Meiser, A., et al. "Semiconductor Device Including a Fin and a Drain Extension Region and Manufacturing Method." U.S. Appl. No. 13/692,462, filed Dec. 3, 2012.
Schloesser, T., et al. "Semiconductor Device and Method for Manufacturing a Semiconductor Device." U.S. Appl. No. 13/627,215, filed Sep. 26, 2012.

* cited by examiner

SEMICONDUCTOR DEVICE

BACKGROUND

Power transistors commonly employed in automotive and industrial electronics require a low on-state resistance ($R_{on}$), while securing a high voltage blocking capability. For example, a MOS ("metal oxide semiconductor") power transistor should be capable, depending upon application requirements to block drain to source voltages $V_{ds}$ of some tens to some hundreds or thousands of volts. MOS power transistors typically conduct very large currents which may be up to some hundreds of Amperes at typical gate-source voltages of about 2 to 20 V.

Lateral power devices, in which current flow mainly takes place parallel to a main surface of a semiconductor substrate, are useful for semiconductor devices in which further components, such as switches, bridges and control circuits are integrated.

For example, power transistors may be used in DC/DC or AC/DC converters to switch a current through an inductor. In these converters frequencies in a range from several kHz up to several MHz are employed. In order to reduce switching losses, attempts are being made to minimize capacitances in the power transistors. Thereby, switching operations may be accelerated.

SUMMARY

According to an embodiment, a semiconductor device comprises a transistor in a semiconductor substrate including a main surface. The transistor comprises a source region, a drain region, a channel region, and a gate electrode. The source region and the drain region are disposed along a first direction, the first direction being parallel to the main surface. The channel region is disposed between the source region and the drain region. The channel region has a shape of a ridge extending along the first direction, the ridge including a top side and first and second sidewalls. The gate electrode is disposed at the first sidewall of the channel region, and the gate electrode is absent from the second sidewall of the channel region.

According to a further embodiment, a semiconductor device comprises a transistor formed in a semiconductor substrate comprising a main surface. The transistor comprises a source region, a drain region, a channel region, a gate trench adjacent to a first sidewall of the channel region, a gate conductive material being disposed in the gate trench, the gate conductive material being connected to a gate terminal, and a channel separation trench adjacent to a second sidewall of the channel region. The channel separation trench is filled with an insulating separation trench filling or has a conductive filling that is disconnected from the gate terminal. The source region and the drain region are disposed along a first direction, the first direction being parallel to the main surface.

According to a further embodiment, a semiconductor device comprises an array of transistors formed in a semiconductor substrate comprising a main surface. The array of transistors comprises a source region, a drain region, a plurality of channel regions, and a plurality of trenches adjacent to each of the channel regions, respectively, so that two trenches are adjacent to one of the channel regions. The plurality of trenches includes gate trenches and channel separation trenches. The semiconductor device further comprises a gate conductive material connected to a gate terminal, the gate conductive material being disposed in the gate trenches. The source region and the drain region are disposed along a first direction, the first direction being parallel to the main surface. At least one of the trenches is a channel separation trench, the channel separation trench being either filled with a dielectric material or having a conductive filling disconnected from the gate terminal.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments and are incorporated in and constitute a part of this specification. The drawings illustrate the main embodiments and together with the description serve to explain the principles. Other embodiments and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

Figure 1A:
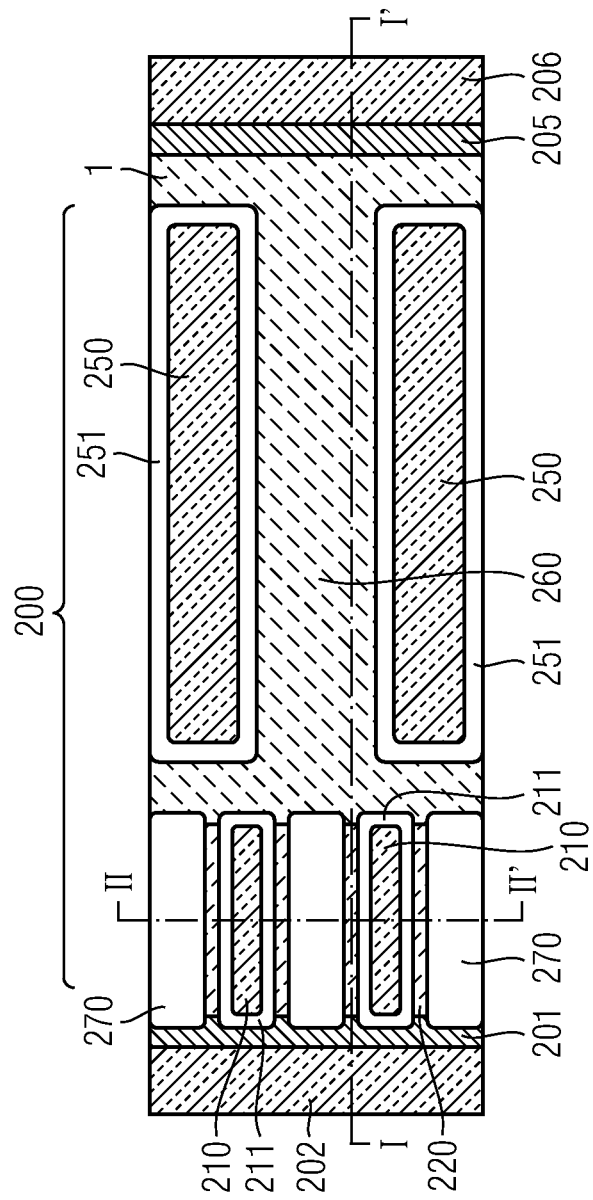
FIG. 1A shows a cross-sectional view of a semiconductor device according to an embodiment in a plane parallel to a main surface of a semiconductor substrate.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, MOSFETs may be n-channel or p-channel MOSFETs. For example, in an n-channel MOSFET, the source and the drain region are doped with n-type dopants, and the current direction is from the drain region to the source region. In a p-channel MOSFET, the source and the drain region are doped with p-type dopants, and the current direction is from the source region to the drain region. As is to be clearly understood, within the context of the present specification, the doping types may be reversed. If a specific current path is described using directional language, this description is to be merely understood to indicate the path and not the polarity of the current flow, i.e. whether the transistor is a p-channel or an re-channel transistor. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

Embodiments are described while specifically referring to so-called normally-off transistors, i.e. transistors which are in an off-state when no gate voltage or a gate voltage of 0V is applied. As is to be clearly understood, the present teaching can be equally applied to normally-on transistors, i.e. transistors which are in a conducting state when no gate voltage or a gate voltage of 0V is applied.

FIG. 1A shows a cross-sectional view of a semiconductor device 1 or an integrated circuit which is taken in a plane parallel to a main surface of a semiconductor substrate. The semiconductor device 1 includes a transistor 200. The transistor 200 shown in FIG. 1A comprises a source region 201, a drain region 205, a channel region 220, and a drift zone 260. The source region 201, the drain region 205 and the drift zone 260 may be doped with dopants of a first conductivity type, for example n-type dopants. The doping concentration of the source and the drain regions 201, 205 may be higher than the doping concentration of the drift zone 260. The channel region 220 is arranged between the source region 201 and the drift zone 260. The channel region 220 is doped with dopants of a second conductivity type, for example with p-type dopants. The drift zone 260 may be arranged between the channel region 220 and the drain region 205. The source region 201, the channel region 220, the drift zone 260 and the drain region 205 are disposed along a first direction parallel to a main surface of the semiconductor substrate. The source region 201 is connected to the source electrode 202. The drain region 205 is connected to the drain electrode 206. The semiconductor device 1 further comprises a gate electrode 210. The gate electrode 210 is insulated from the channel region 220 by means of an insulating gate dielectric material 211 such as silicon oxide. According to an embodiment, the transistor may further comprise a field plate 250 which is arranged adjacent to the drift zone 260. The field plate 250 is insulated from the drift zone 260 by means of an insulating field dielectric layer 251 such as silicon oxide. The transistor 200 is a lateral transistor. Accordingly, a current flow from the source region 201 to the drain region 205 is mainly accomplished in the first direction parallel to the main surface of the semiconductor substrate.

When a suitable voltage is applied to the gate electrode 210, an inversion layer is formed at the boundary between the channel region 220 and the insulating gate dielectric material 211. Accordingly, the transistor is in a conducting state from the source region 201 to the drain region 205 via the drift zone 260. The conductivity of the channel that is formed in the channel region 220 is controlled by the gate electrode. By controlling the conductivity of the channel formed in the channel region, the current flow from the source region 201 via the channel formed in the channel region 220 and the drift zone 260 to the drain region 205 may be controlled.

When the transistor is switched off, no conductive channel is formed at the boundary between the channel region 220 and the insulating gate dielectric material 211 so that a sub-threshold current flows.

According to an embodiment, the transistor may be implemented as a normally-off transistor. According to a further embodiment, the transistor may be implemented as a normally-on transistor. In this case, the channel region 220 may be doped with dopants of the first conductivity type, for example, with n-type dopants.

An appropriate voltage may be applied to the field plate in an off-state. For example, the field plate 250 may be electrically connected to a source terminal, which is also electrically connected to a source electrode 202. In an off-state, the field plate 250 depletes charge carriers from the drift zone 260 so that the breakdown voltage characteristics of the transistor

200 are improved. In a transistor 200 comprising the field plate 250 the doping concentration of the drift zone 260 may be increased without deteriorating the breakdown voltage characteristics in comparison to a device without a field plate. Due to the higher doping concentration of the drift zone, the on-resistance $RDS_{on}$ is further decreased resulting in improved device characteristics.

The semiconductor device 1 further comprises channel separation trenches 270. Due to the presence of the channel separation trenches 270, the width of the channel region 220 is decreased. Thereby, it is possible to implement a fully depleted transistor. In transistors having a relatively high breakdown voltage, a reduction of the width of the active channel does not degrade the on-state resistance (Ron×A), since the on-state resistance is mainly determined by the properties of the drift region. The separation trenches may be filled with insulating material or may include a conductive filling that is disconnected from a gate potential. Accordingly, the number of active trenches including a gate electrode is reduced in the semiconductor device 1.

Figure 1B:
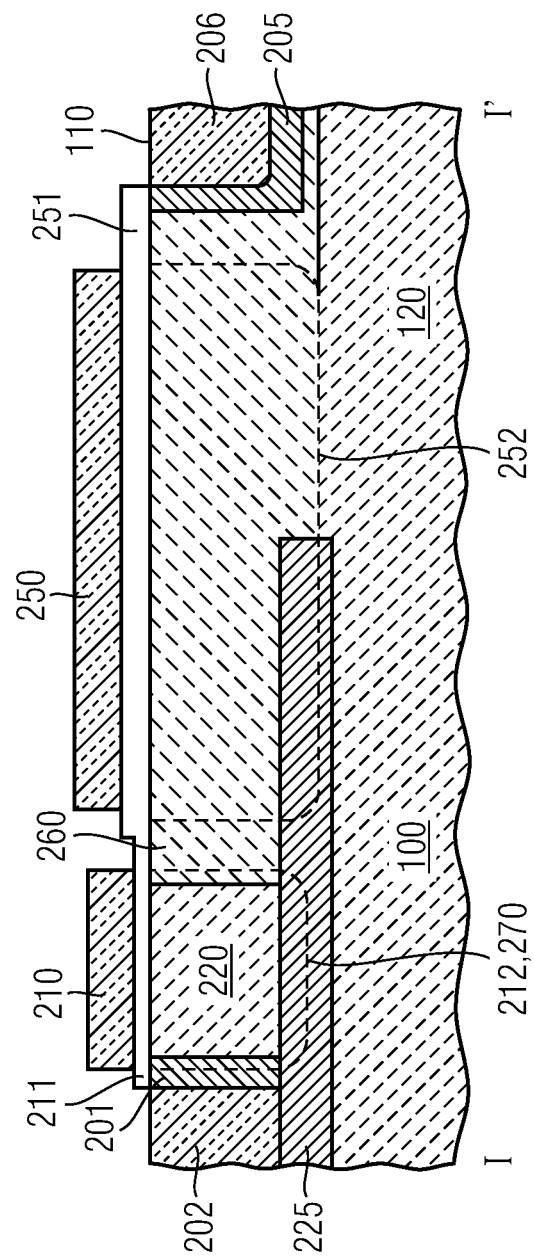
FIG. 1B shows a first cross-sectional view of the semiconductor device shown in FIG. 1A.

FIG. 1B illustrates a cross-sectional view of the semiconductor device 1 between I and I' along the first direction, as is also indicated in FIG. 1A. The cross-sectional view of FIG. 1B is taken so as to intersect the channel region 220 and the drift zone 260. As is indicated by dotted lines, gate trenches 212 are disposed adjacent to the channel region 220 in a plane before and behind the depicted plane of the drawing. Further, field plate trenches 252 may be disposed adjacent to the drift zone 260 in a plane before and behind the depicted plane of the drawing. The gate trench 212 and the field plate trench 252 extend from the main surface 110 in a depth direction of the substrate 100. As a consequence, the gate electrode is adjacent to at least two sides of the channel region 220. Further, the channel region 220 has the shape of a first ridge. Due to the presence of the field plate trenches 252, according to an embodiment, the drift zone 260 may have the shape of a second ridge.

The source region 201 extends from the main surface 110 into a depth direction of the substrate 100, i.e. perpendicularly with respect to the main surface 110. The drain region 205 likewise extends from the main surface 110 in a depth direction of the substrate 100. FIG. 1B further shows a body connect implantation region 225 that is disposed beneath the channel region 220 and beneath a part of the drift zone 260. The body connect implantation portion 225 electrically connects the channel region to the source electrode 202 and further suppresses or deteriorates a parasitic bipolar transistor. Moreover, the body connect implantation portion 225 may extend beneath the drift zone 260 so that in an off-state of the transistor, the drift zone 260 may be depleted more easily. The body connect implantation portion 225 may be doped with dopants of the second conductivity type at a higher concentration than the channel region.

Figure 1C:
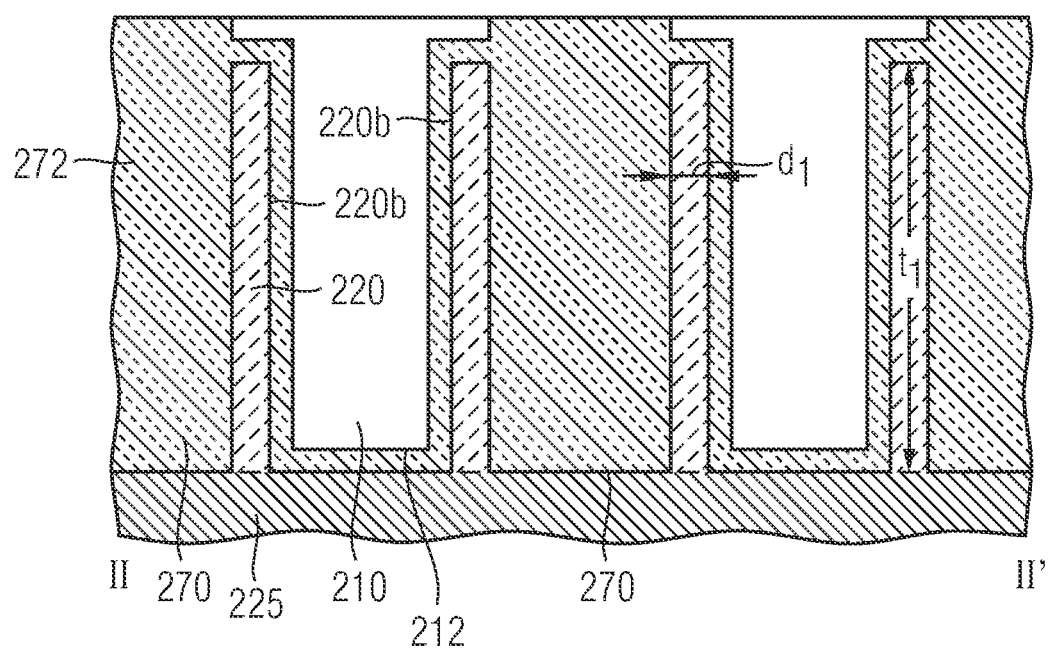
FIG. 1C shows a cross-sectional view of the semiconductor device shown in FIG. 1A in a direction perpendicular to the direction of the cross-sectional view of FIG. 1B.

FIG. 1C illustrates a cross-sectional view of the semiconductor device which is taken between II and II' as is also illustrated in FIG. 1A. The direction between II and II' is perpendicular to the first direction. As is shown in FIG. 1C, the channel region 220 has the shape of a ridge, the ridge having a width d1. For example, the ridge may have a top side, a first sidewall 220b and a second sidewall 220a. The sidewalls 220b, 220a may extend perpendicularly or at an angle of more than 75° with respect to the main surface 110.

According to the embodiment of FIG. 1C, a semiconductor device 200 comprises a transistor 200. The transistor 200 comprises a source region 201, a drain region 205, a channel region 220 and a gate electrode 210. The channel region 220 is disposed along a first direction between the source region 201 and the drain region 205, the first direction being parallel to the main surface. The channel region 220 has a shape of a ridge extending along the first direction, the ridge including a top side 220c, a first sidewall 220b and a second sidewall 220a. The gate electrode 210 is adjacent to the first sidewall 220b of the channel region, and the gate electrode is absent from the second sidewall 220a of the channel region 220.

When the semiconductor device 1 is operated in an on-state, a conductive inversion layer is formed along the first sidewall 220b. Due to the absence of the gate electrode at the second sidewall 220a of the channel region 220, no conductive inversion layer is formed at the second sidewall 220a.

The semiconductor device 1 may comprise a channel separation element adjacent to the second sidewall 220b of the channel region 220.

For example, the channel separation element may comprise a channel separation trench 270 filled with a separation trench filling.

According to a further embodiment, the channel separation trench 270 may include a conductive filling 274 and a separation dielectric 275 disposed between the conductive filling 274 and the channel region 220. The thickness of the separation dielectric 275 may be larger than the thickness of the gate dielectric 211 between the gate electrode 210 and the channel region 220.

According to an embodiment, the source region 201 and the conductive filling 274 of the channel separation trench 270 may be connected to a source terminal 280.

The width of the several gate trenches 212 and of the several channel separation trenches 270 may be different from each other.

According to an embodiment, the width d1 of the channel region 220 fulfills the following relationship: $d1 \leq l_d$, wherein $l_d$ denotes a length of a depletion zone which is formed at the interface between the gate dielectric layer 211 and the channel region 220. For example, the width of the depletion zone may be determined as:

$$l_d = \sqrt{\frac{4\varepsilon_s kT \ln(N_A/n_i)}{q^2 N_A}}$$

wherein $\varepsilon_s$ denotes the permittivity of the semiconductor material (11.9×$\varepsilon_0$ for silicon, $\varepsilon_0$=8.85×10$^{-14}$ F/cm), k denotes the Boltzmann constant (1.38066×10$^{-23}$ J/k), T denotes the temperature, ln the denotes the natural logarithm, $N_A$ denotes the impurity concentration of the semiconductor body, $n_i$ denotes the intrinsic carrier concentration (1.45×10$^{10}$ cm$^{-3}$ for silicon at 27° C.), and q denotes the elementary charge (1.6×10$^{-19}$ C).

Generally, the length of the depletion zone varies depending from the gate voltage. It is assumed that in a transistor the length of the depletion zone at a gate voltage corresponding to the threshold voltage corresponds to the maximum width of the depletion zone. For example, the width of the first ridges may be approximately 10 to 200 nm, for example, 20 to 60 nm along the main surface 110 of the semiconductor substrate 100.

Moreover, the ratio of length to width may fulfill the following relationship: $s_1/d_1 > 2.0$, wherein s1 denotes the length of the first ridge overlapping with the gate electrode 210, or, differently stated, the length of the channel region, measured along the first direction, as is also illustrated in FIG. 1. According to further embodiments, $s_1/d_1 > 2.5$.

According to the embodiment in which the width $d1 \leq l_d$, the transistor 200 is a so-called "fully-depleted" transistor in which the channel region 220 is fully depleted when the gate electrode 210 is set to an on-voltage. In such a transistor, an optimal sub-threshold voltage may be achieved and short channel effects may be efficiently suppressed, resulting in improved device characteristics.

Due to the feature that the gate electrode is absent from the second sidewall of the channel region, the gate capacitance may be decreased resulting in reduced switching losses. According to an embodiment, the channel separation trench includes a conductive filling and a separation dielectric 275 disposed between the conductive filling 274 and the channel region 220. The thickness of the separation dielectric 275 may be larger than the thickness of the gate dielectric 211 between the gate electrode 210 and the channel region 220. As has been found out, due to this feature, a voltage applied to the gate electrode becomes almost completely effective at the gate electrode. To be more specific, due to the increased thickness of the separation dielectric 275 in comparison to the gate dielectric 211, the conductive filling 274 in the channel separation trench 270 is prevented from acting as a voltage divider taking up part of the applied gate voltage. As a result, the steepness of the sub-threshold slope of the current-voltage characteristics of the transistor may be further increased.

According to a further embodiment, the channel separation trench 270 may be filled with an insulating material. Due to reasons of symmetry, such a separation trench acts like an SOI (silicon-on-insulator) substrate having an insulator of an infinite thickness.

According to an embodiment, the drift zone 260 may comprise a flat surface which is not patterned to form ridges. According to a further embodiment, the field plate 250 may be arranged in trenches 252 so that the drift zone 260 comprises ridges. In a transistor including a field plate 250, it may be desirable to use a drift zone 260 having a width d2 which is larger than the width d1 of the channel region to limit e.g. the output capacitance $C_{oss}$. Hence, the field plate trenches 252 may be disposed at a larger distance so that the portions of the drift zone 260 which are disposed between adjacent field plate trenches 252, have a larger width. According to another embodiment, d2 may be chosen to be smaller than d1. Typically, the thickness of the field dielectric layer between the field plate and the drift zone is thicker than the thickness of the gate dielectric layer to increase the drain-source breakdown voltage. This may result in a greater pitch of the field plate trenches in comparison with the gate trenches and the separation trenches.

In order to improve the characteristics of the semiconductor device in the channel region and to further improve the device characteristics in the drift zone, patterning the gate electrode and the field plate may be accomplished using an appropriate etching mask so as to provide a different width of the first and second ridges.

As will be further explained herein below, this may be accomplished by forming a set of gate trenches 212 having a smaller pitch and by forming a set of field plate trenches 252 having a larger pitch. According to an embodiment, the gate trenches 212 and the field plate trenches 252 may be separate from each other. According to a further embodiment, the gate trenches 212 and the field plate trenches 252 may be merged so as to form one single trench having different width.

The semiconductor devices illustrated in FIGS. 1A to 1C implement lateral power transistors. They may be employed in DC/DC or AC/DC converters since they may be integrated in an easy manner. Further, they may achieve high current densities so that they may be employed for small power and voltages between 10V and several hundred Volts.

Figure 2A:
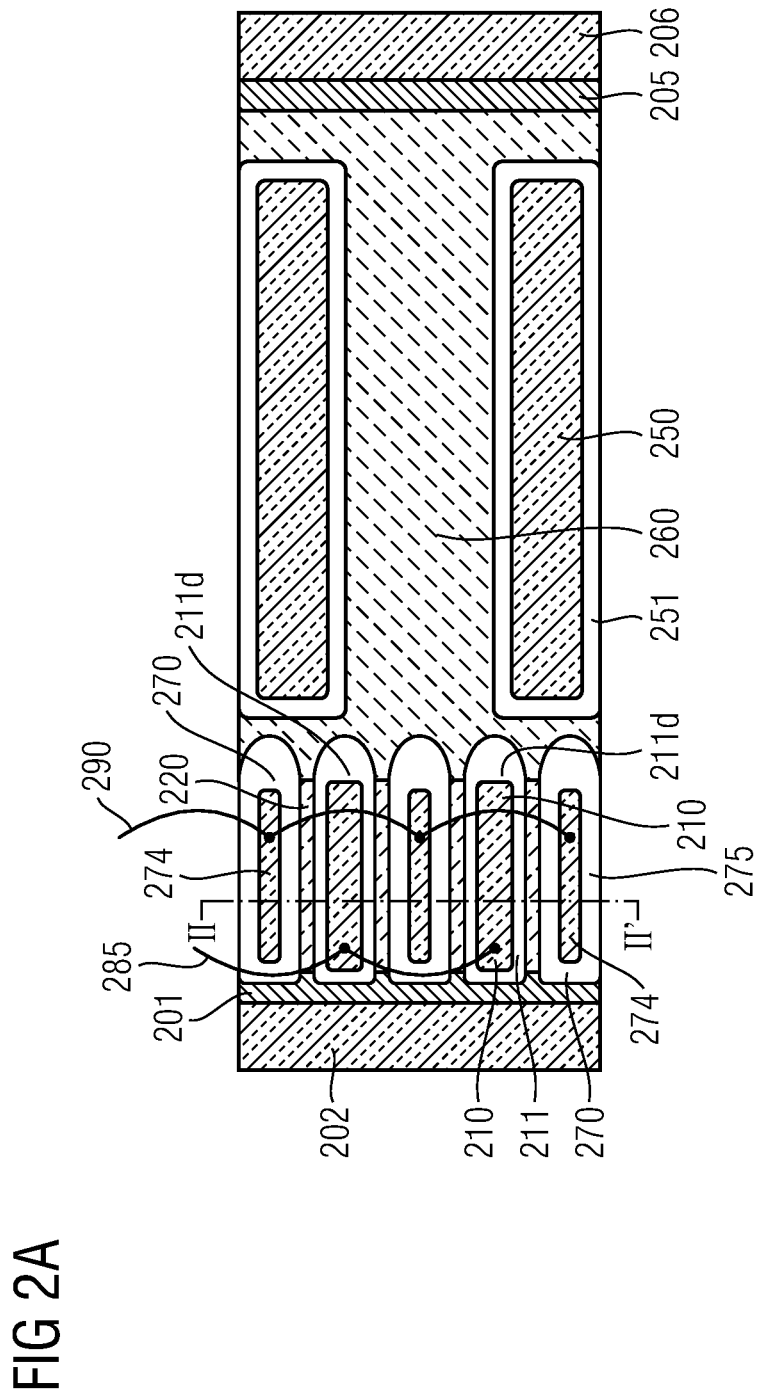
FIG. 2A shows a cross-sectional view of a semiconductor device according to a further embodiment.

FIG. 2A shows a cross-sectional view of a semiconductor device or an integrated circuit according to an embodiment in a plane that is parallel to the main surface of the semiconductor substrate. The semiconductor device includes channel separation trenches 270. In the embodiment of FIG. 2A, the channel separation trenches 270 include a conductive filling 274. A separation dielectric layer 275 is disposed between the conductive filling 274 and the adjacent channel region 220. The conductive filling 274 is connected to a terminal 290 that is connected to a potential different from the gate potential. For example, the conductive filling 274 may be connected to the source terminal or may be grounded. Thereby, the gate-drain capacitance may be further decreased. The separation dielectric layer 275 may have a greater thickness than the gate dielectric layer 211. According to a further embodiment, the thickness of the separation dielectric layer 275 may be equal to the thickness of the gate dielectric layer 211. According to an embodiment, a thickness of the gate dielectric layer 211 at a portion 211d adjacent to the drain region 205 may be larger than a thickness of the gate dielectric layer 211 at a portion adjacent to the channel region 220. The further components of the embodiment shown in FIG. 2A are similar to those of FIG. 1A.

Figure 2B:
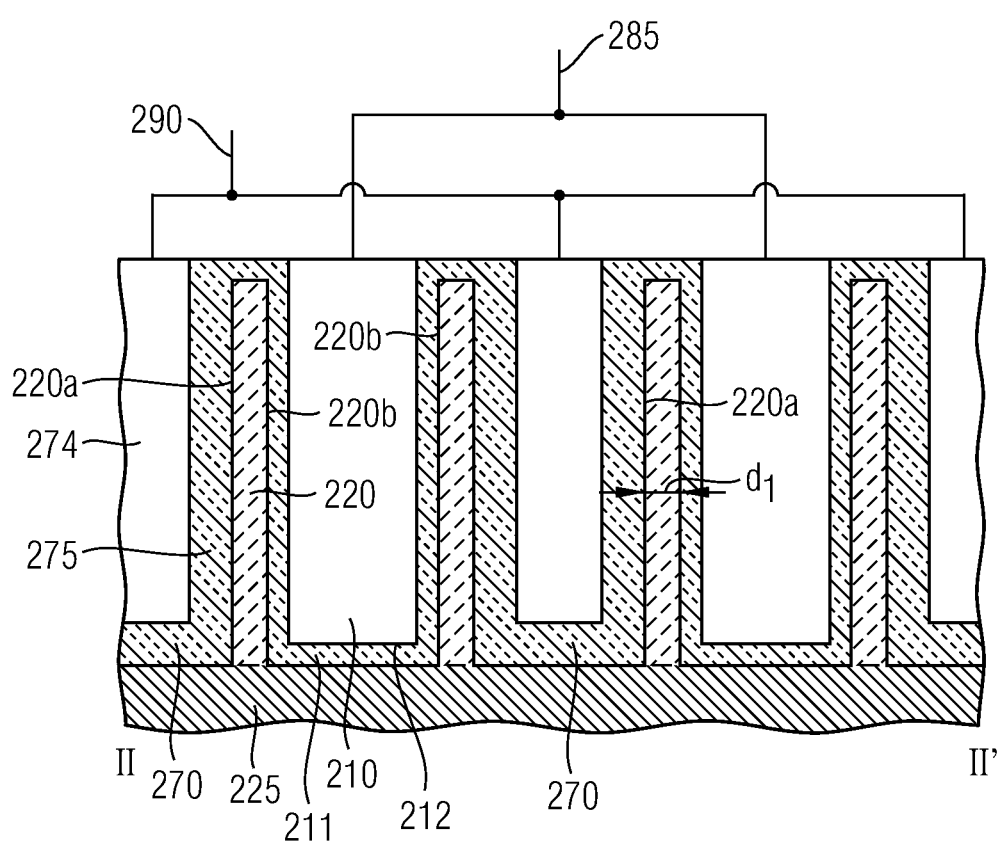
FIG. 2B shows a cross-sectional view of the semiconductor device shown in FIG. 2A.

FIG. 2B shows a cross-sectional view of the semiconductor device shown in FIG. 2A between II and II', as is also indicated in FIG. 2A. As is shown, the gate electrode 210 is disposed adjacent to a first sidewall 220b of the channel region 220. Further, channel separation trenches 270 are adjacent to a second sidewall 220a of each of the channel regions 220. A conductive filling 274 is disposed in the channel separation trenches 270.

The gate electrodes 210 are connected to a gate terminal 285. Further, the conductive filling 274 of the channel separation trenches 270 is connected to a terminal 290 different from the gate terminal 285. As a consequence, the gate drain capacitances may be decreased. Moreover, the thickness of the separation dielectric layer 275 may be larger than the thickness of the gate dielectric layer 211. Thereby, the steepness of the sub-threshold slope of the current-voltage characteristics of the transistor may be further increased.

The concept explained above may be modified in various ways. For example, the drift zone 260 may be implemented in different manners. Further, the semiconductor device may be implemented without field plates including a conductive filling. For example, the semiconductor device may comprise, for example, a stack of alternating p- and n-doped compensation areas extending in the first direction, as is conventional. Thereby, a compensation device or superjunction device may be implemented. According to still a further embodiment, the drift region may be dispensed with.

Figure 2C:
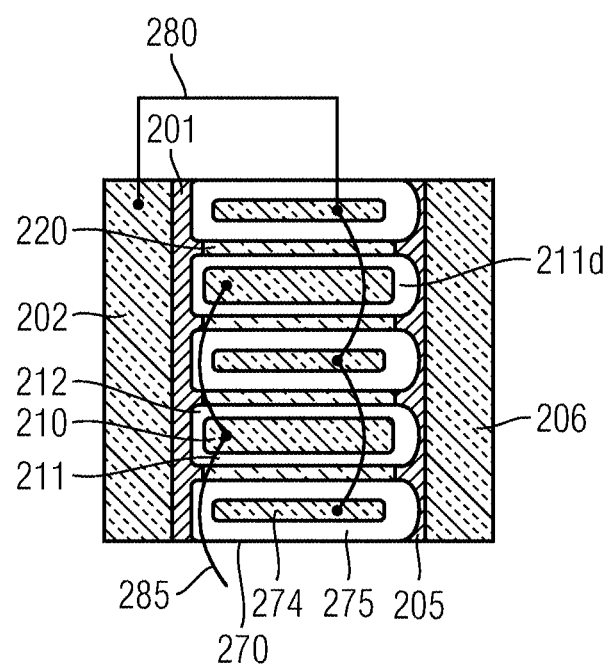
FIG. 2C shows a cross-sectional view of a further semiconductor device.

FIG. 2C shows a cross-sectional view of the embodiment, according to which the drain region 205 is directly adjacent to the channel region 220 without a drift zone 260 disposed between the channel region and the drain region 205. According to the implementation shown in FIG. 2C, the thickness of the gate dielectric layer 211 in the portion 211d adjacent to the drain region 205 may be increased so as to further reduce the gate-drain capacitance.

Figure 3A:
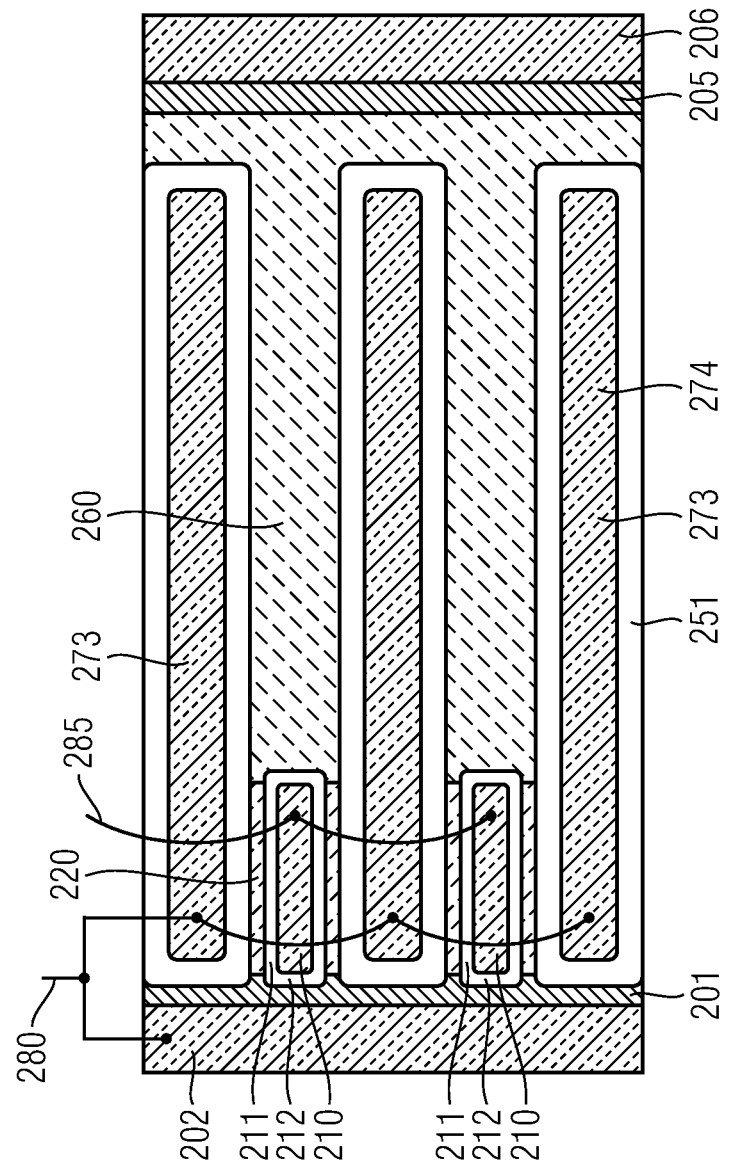
FIG. 3A shows a cross-sectional view of a semiconductor device according to an embodiment.

FIG. 3A shows a cross-sectional view of a further embodiment of a semiconductor device or an integrated circuit. The cross-sectional view of FIG. 3A is taken parallel to the main surface of the substrate. According to the embodiment of FIG. 3A, the channel separation trenches 270 including a conductive filling 274 are connected to the field plate trenches so as to form extended field plate trenches 273. Hence, the semiconductor device according to the embodiment of FIG. 3A includes gate trenches 212 including the gate electrode 210 that is insulated from the adjacent channel region by means of the gate dielectric 211. The semiconductor device further comprises extended field plate trenches 273 that extend to the channel region 220. The extended field plate trenches are filled with a conductive filling 274 that may be connected to a source terminal 280. The conductive filling 274 of the extended field plate trenches 273 is insulated from the channel region by means of the field dielectric layer 251. The thickness of the field dielectric layer 251 may be larger than the thickness of the gate dielectric layer 211. The channel region 220 includes a first sidewall 220b and a second sidewall 220a, the gate electrode 210 being adjacent to the first sidewall. Further, the conductive filling 274 is adjacent to the second sidewall 220a of the ridges. Since the conductive filling 274 is not connected to the gate terminal, a depletion region is only formed at the interface of the first sidewall 220b with the gate dielectric 211, when a suitable gate voltage is applied to the gate terminal 285. In the semiconductor device shown in FIG. 3A, the effective gate area may be decreased, resulting in a reduced gate capacitance.

Figure 3B:
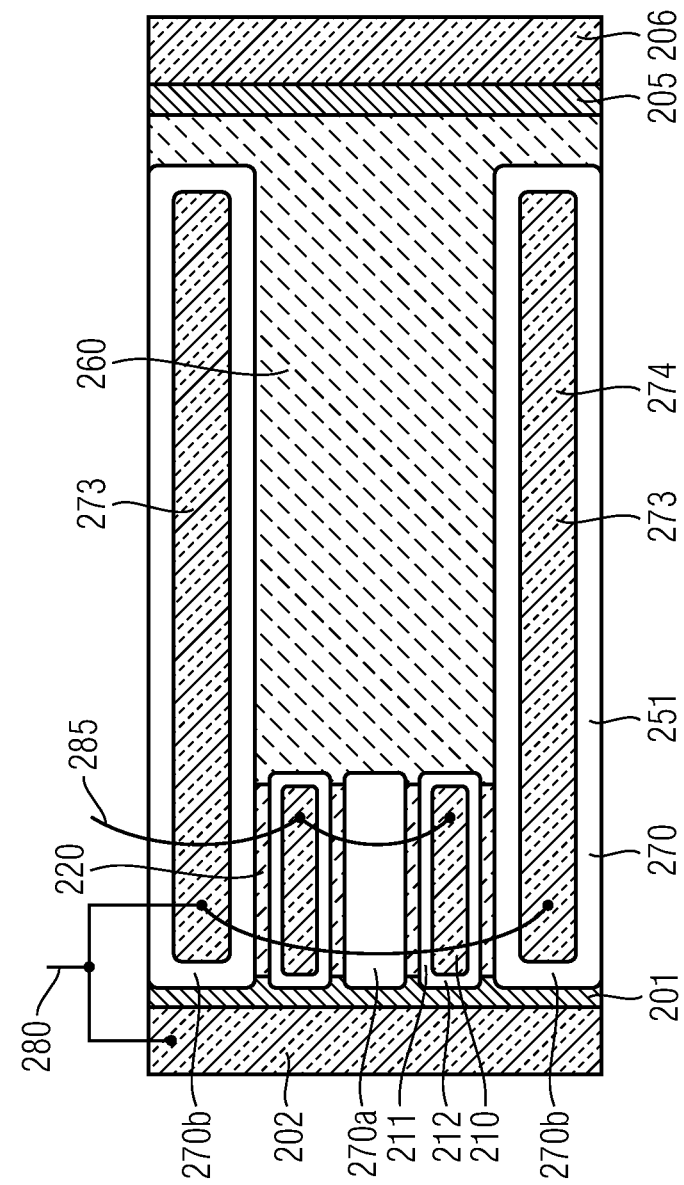
FIG. 3B shows a cross-sectional view of a semiconductor device according to a further embodiment.

FIG. 3B shows a cross-sectional view of a semiconductor device or integrated circuit according to a further embodiment. In a similar manner as is shown in FIG. 3A, the gate trenches 212 and the channel separation trenches 270 are disposed in an alternating manner so that one gate trench 212 is adjacent to a first sidewall 220b of each of the channel regions 220 and one channel separation trench 270a, 270b is adjacent to a second sidewall 220a of each of the channel regions. As is further shown in FIG. 3B, the channel separation trenches 270 include first channel separation trenches 270a that are filled with an insulating material and second channel separation trenches 270b that are filled with a conductive filling 273 and a field dielectric layer 251 between the conductive filling 273 and the channel region 220. As is further illustrated in FIG. 3B, the second channel separation trenches 270b are implemented as extended field plate trenches 273 that extend to the drift zone 260 to form the field plate trenches. The thickness of the field dielectric layer 251 may be larger than the thickness of the gate dielectric layer 211.

Figure 3C:
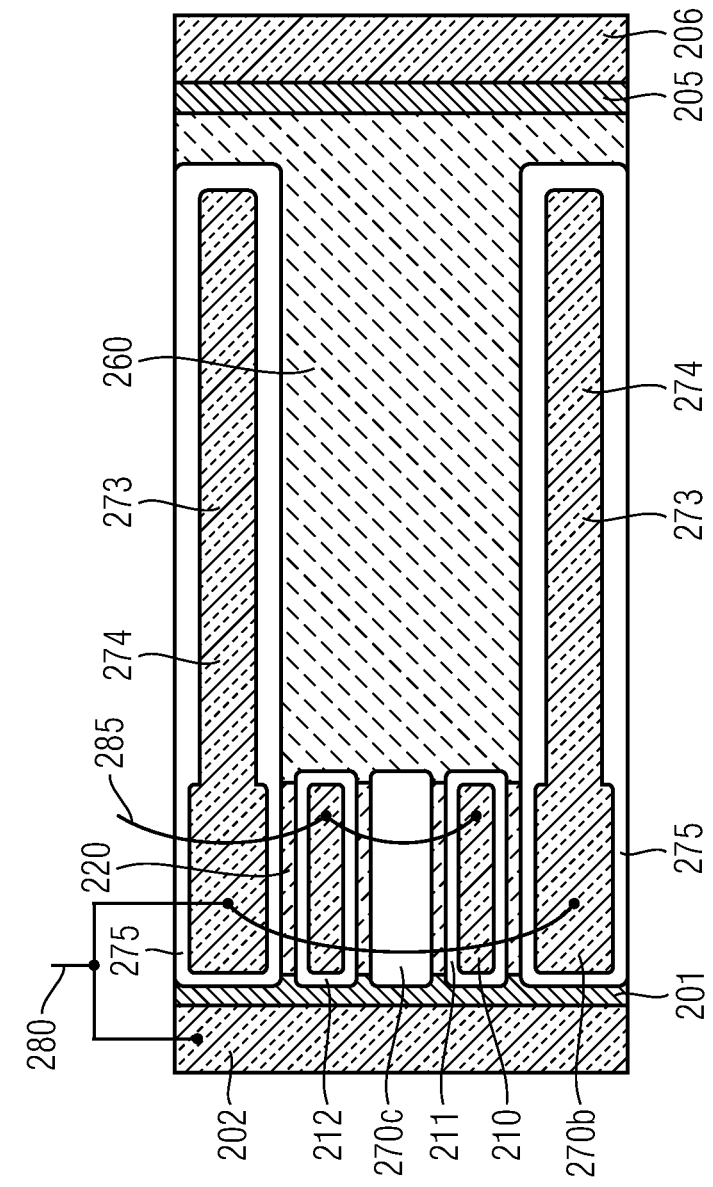
FIG. 3C shows a cross-sectional view of a semiconductor device according to still another embodiment.

FIG. 3C shows a cross-sectional view of a semiconductor device or integrated circuit according to a further embodiment. As is illustrated, the separation dielectric layer 275, that is adjacent to the channel region 220, may have a thickness that is approximately equal to the thickness of the gate dielectric layer 211. Moreover, the second channel separation trenches are implemented as extended field plate trenches 273 in which the conductive filling 274 of the separation trenches extends to the drift zone 260 to form a field plate. The separation dielectric layer 275 has a larger thickness in a region adjacent to the drift zone 260 than in a region adjacent to the channel region 220. As has been discussed hereinabove, a semiconductor device 1 comprises an array of transistors 200 formed in a semiconductor substrate 100 comprising a main surface 110. The array of transistors 200 comprises a source region 201, a drain region 205, a plurality of channel regions 220, and a plurality of trenches 212, 270 adjacent to each of the channel regions 220, so that two trenches are adjacent to one of the channel regions. The plurality of trenches includes gate trenches 212 and channel separation trenches 270. The semiconductor device comprises a gate conductive material 210 connected to a gate terminal 285, and the gate conductive material 210 is disposed in the gate trenches 212. The channel region 220 is disposed along a first direction between the source region 201 and the drain region 205, the first direction being parallel to the main surface 110. At least one of the trenches is a channel separation trench 270, the channel separation trench 270 being either filled with a dielectric material 272 or being lined with a dielectric material and filled with a conductive filling 274 that is disconnected from the gate terminal 285.

According to an embodiment, the gate trenches 212 and the channel separation trenches 270 are disposed in an alternating manner so that one gate trench 212 and one channel separation trench 270 are adjacent to different sidewalls 220b, 220a of each of the channel regions 220.

According to an embodiment, the channel separation trenches 270 include first channel separation trenches 270a filled with an insulating material and second channel separation trenches 270b filled with a conductive filling 274 and a separation dielectric layer 275 between the conductive filling 274 and the channel region 220.

Hence, the number of active gate trenches is reduced in the semiconductor device 1. The conductive inversion layer is formed at only one sidewall of the channel region. In devices having a higher breakdown voltage, a reduction of the density of active channels should have a small influence on Ron×A, which is mainly determined by the properties of the drift zone 260. Accordingly, the gate capacitance may be decreased without deteriorating the on-state resistance (Ron×A). Further, according to an embodiment, the gate capacitance may be decreased without deteriorating the sub-threshold slope of the current-voltage characteristics.

In other embodiments, the transistor may be implemented as a normally-on device. In this case, the channel region may be of the same conductivity type as the source and drain regions.

The transistor described refers to a MOSFET ("metal oxide semiconductor field effect transistor"), in which a gate dielectric material such as silicon oxide is disposed between the gate electrode and the channel region. According to a further embodiment, the transistor may be a JFET ("junction field effect transistor") in which the gate electrode is directly adjacent to the channel region, without a gate dielectric material being disposed between the gate electrode and the channel region. According to this embodiment, the channel region may be doped with n-type dopants. The gate electrode may be implemented by p-doped semiconductor material, for example, p-doped polysilicon. Further components of the semiconductor device may be implemented in a manner as has been described above.

According to a further embodiment, the semiconductor device may further comprise contacts to a second main surface which is opposite to the first main surface 110 of the semiconductor substrate 100. According to an embodiment, the source electrode 202 that is electrically coupled to the source region 201, may extend to the first main surface 110 and the drain electrode 206 that is electrically coupled to the drain region 205, may extend to the second main surface being opposite to the first main surface 110.

While embodiments of the invention have been described above, it is obvious that further embodiments may be implemented. For example, further embodiments may comprise any sub-combination of features recited in the claims or any sub-combination of elements described in the examples given above. Accordingly, this spirit and scope of the appended claims should not be limited to the description of the embodiments contained herein.

What is claimed is:

1. A semiconductor device comprising a transistor in a semiconductor substrate including a main surface, the transistor comprising:
   a source region of a first conductivity type;
   a drain region of the first conductivity type;

a channel region of a second conductivity type;
a gate electrode; and
a field plate,
wherein the source region and the drain region are disposed along a first direction, the first direction is parallel to the main surface, the channel region is disposed between the source region and the drain region, the channel region is patterned into a ridge extending along the first direction by adjacent trenches extending in the first direction in the semiconductor substrate, the gate electrode is disposed in a first one of the trenches adjacent to the channel region, the gate electrode is absent from a second one of the trenches adjacent to the channel region, and the field plate is disposed in field plate trenches which are separate from the trenches.

2. The semiconductor device according to claim 1, wherein a conductive inversion layer is formed along a first sidewall in an on-state.

3. The semiconductor device according to claim 1, further comprising a channel separation element adjacent to a second sidewall of the channel region, the second sidewall being on a side of the second ones of the trenches.

4. The semiconductor device according to claim 3, wherein the channel separation element comprises a channel separation trench filled with a separation trench filling.

5. The semiconductor device according to claim 3, wherein the channel separation element comprises a channel separation trench including a conductive filling and a separation dielectric disposed between the conductive filling and the channel region.

6. The semiconductor device according to claim 5, wherein a thickness of the separation dielectric is larger than a thickness of a gate dielectric between the gate electrode and the channel region.

7. The semiconductor device according to claim 5, wherein the source region and the conductive filling of the channel separation trench are electrically connected to a source terminal.

8. The semiconductor device according to claim 1, further comprising a drift zone between the channel region and the drain region.

9. The semiconductor device according to claim 4, further comprising a drift zone and a field plate at the drift zone, wherein the field plate is connected to the channel separation trench.

10. The semiconductor device according to claim 1, wherein a width d of the ridge is: $d<ld$, wherein ld denotes a length of a depletion zone formed at an interface between the ridge and the gate electrode.

11. An integrated circuit comprising the semiconductor device according to claim 1.

* * * * *